(12) United States Patent
Terasaki et al.

(10) Patent No.: US 6,376,050 B1
(45) Date of Patent: Apr. 23, 2002

(54) ELECTRIC CONNECTING METHOD AND APPARATUS

(75) Inventors: Tohru Terasaki, Tokyo; Noriyuki Honda; Seiichi Miyachi, both of Aichi; Yasuhiro Suga, Tochigi, all of (JP)

(73) Assignees: Sony Corporation; Sony Chemicals Corporation, both of Tokyo (JP)

(*) Notice: Subject to any disclaimer, the term of this patent is extended or adjusted under 35 U.S.C. 154(b) by 0 days.

(21) Appl. No.: 09/471,241

(22) Filed: Dec. 23, 1999

(30) Foreign Application Priority Data

Dec. 25, 1998 (JP) .......................... 10-371005

(51) Int. Cl.⁷ .............................. B32B 5/16; H05W 1/02
(52) U.S. Cl. ..................... 428/209; 428/323; 428/343; 428/344; 428/355 R; 428/213; 428/901; 174/259
(58) Field of Search ................. 428/323, 330, 428/209, 343, 344, 355 R, 901, 213; 174/117 A, 259

(56) References Cited

U.S. PATENT DOCUMENTS

| | | | |
|---|---|---|---|
| 4,588,456 A | * 5/1986 | Dery et al. | 156/52 |
| 4,642,421 A | * 2/1987 | Dery et al. | 174/88 R |
| 5,174,766 A | * 12/1992 | Yoshizawa et al. | 439/91 |
| 5,685,939 A | * 11/1997 | Wolk et al. | 156/234 |
| 5,820,716 A | * 10/1998 | Tuttle | 156/85 |
| 6,034,331 A | * 3/2000 | Tsukagoshi et al. | 174/250 |
| 6,048,420 A | * 4/2000 | Tuttle | 156/3.5 |

FOREIGN PATENT DOCUMENTS

JP         361195178 A    *  8/1986

* cited by examiner

*Primary Examiner*—Deborah Jones
*Assistant Examiner*—Stephen Stein
(74) *Attorney, Agent, or Firm*—Sonnenschein, Nath & Rosenthal (57) ABSTRACT

An electrically connecting device and an electrical connecting method in which electrical connections can be positively realized via electrically conductive particles despite slight irregularities of objects to be eclectically connected to each other. The electrical connecting device 100 electrically connects an electrically connection portion 5 of the first object and the electrically connection portion 3 of the second object. The electrical connecting device 100 is made up of a first film-shaped adhesive layer 6 and a second film-shaped adhesive layer 9. The first film-shaped adhesive layer 6, arranged on the first object 4, is made up of plural electrically conductive particles 7 and a binder 8 containing the electrically conductive particles 7. The second film-shaped adhesive layer 9, arranged on the first film-shaped adhesive layer 6 containing the electrically conductive particles, is made up only of a fluid binder.

6 Claims, 5 Drawing Sheets

ELECTRIC CONNECTING METHOD AND APPARATUS

BACKGROUND OF THE INVENTION

1. Field of the Invention

This invention relates to a method and an apparatus for electrically connecting an electrical connecting portion of a first object to an electrical connecting portion of a second object.

2. Description of the Related Art

The circuitry used in electronic parts has continued to increase in density and complexity in order to keep up with trends in size and thickness reduction of these parts. For interconnecting such electronic parts to a small-sized electrode, adhesives or film-like products, referred to below as connecting members, exhibiting superior anisotropy and electrical conductivity in order to cope with the finer pitch, are used prevalently.

The connecting members are comprised of an adhesive containing a pre-set quantity of an electrically conductive material, such as electrically conductive particles. These connecting members are provided between projecting electrodes of electronic parts and electrically conductive patterns of a printed circuit board, and are pressurized with or without heating to electrically connect the electrodes of the two components. At the same time, electrically insulating properties are afforded to the neighboring electrodes as the projecting electrode of the electronic part is secured to an electrically conductive pattern of the printed circuit board.

The basic concept for dealing with the connecting member in order to cope with the fine pitch is: 1) to select the particle size of the electrically conductive particles to be smaller than the size of the insulating portion between the neighboring electrodes to maintain insulation between the neighboring electrodes, 2) to set the content of the electrically conductive particles such as to prevent contact of the particles with one another, and 3) to cause the electrically conductive particles to be present positively on the electrodes to realize electrical conductivity in the connecting portion.

However, if, with the above-described conventional method, the electrically conductive particles are reduced in diameter, the electrically conductive particles are increased appreciably in surface area and hence undergo secondary agglomeration so that the particles cohere together. This prevents electrical insulating properties between neighboring electrodes from being maintained.

Conversely, if the content of the electrically conductive particles is decreased, the number of the electrically conductive particles on the electrodes to be interconnected is reduced so that the number of contact points is decreased. This prevents electrical conduction across the connection electrodes and renders it difficult for the connecting members to cope with the fine pitch in order to maintain long-term connection reliability.

As the electrode area or the spacing between neighboring electrodes becomes smaller with the marked tendency to fine pitch, the electrically conductive particles on the electrodes flow along with the adhesive to a gap between the neighboring electrodes under the effect of pressurization or the pressurization/heating at the time of connection to obstruct the connecting member coping with the fine pitch.

In order to solve this problem, proposals have been made for a connecting member in which an insulating coating is applied to electrically conductive particles to increase the number of the electrically conductive particles in the connecting member, and for a connecting member including an adhesive layer containing electrically conductive particles and a layer not containing the electrically conductive particles.

These conventional connecting members are shown in FIGS. 1 and 2.

Referring to FIGS. 1A–D, if an object is a glass substrate 200, having planarity in a mounting area of an integrated circuit (IC) 201 on the order of a fraction of a micrometer, and if a projecting electrode 202 of the IC 201 permits slight height variations of the projecting electrodes (on the order of a fraction of a micrometer) as in case of a gold plating bump, a wiring pattern 203 on the glass pattern 200 is electrically connected to the projecting electrode 202 of the IC 201 via electrically conductive particles 205 contained in the connecting member 204.

The reason may be summarized as follows: The parts, such as IC 201, exhibit planarity, so that, if the thickness of the connecting member 204 is on the order of the height of the projecting electrode 202 plus 5 $\mu$m, the connecting member 204 is positively charged onto the lower surface of the IC 201, so that it is unnecessary to increase the thickness of the connecting member 204 to an extent more than is necessary. It is noted that the height of the projecting electrode 202 s usually 15 to 25 $\mu$m, with an ITO pattern applied to the glass being a few Angstroms thick.

The ITO (indium tin oxide electrode) film is a transparent electrically conductive film affording electrical conductivity to the glass surface for operating as an electrode of a liquid crystal display plate. In an initial state of provisional pressure bonding (pressurization), the electrically conductive particles 205 can be sandwiched between the wiring pattern 203 on the glass substrate 200 and the projecting electrode 202 of the IC 201. If the binder of the connecting member flows out at the time of ultimate pressure bonding (pressurization with heating), the sandwiched electrically conductive particles 205 are not fluidized to establish positive electrical connection across the wiring pattern 203 on the glass substrate 200 and the projecting electrode 202 on the IC 201 via the electrically conductive particles 205.

Figure 1A:
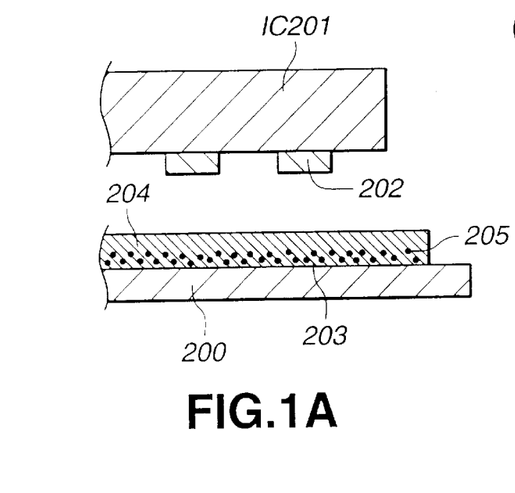
FIGS. 1A, 1B, 1C and 1D are side views of a device cross-section showing a typical electrical connection in a conventional electronic device.

FIG. 1A shows the state in which the connecting member 204, such as an anisotropic electrically conductive film (ACF), has been bonded to the glass substrate 200. The anisotropic electrically conductive film is usually bonded to the glass substrate by thermal pressure bonding (with pressurization under a pressure of 100 N/cm$^2$ and with heating to a temperature of the order of 70 to 100° C.). In this state, the wiring pattern 203 on the glass substrate 200 is aligned with the projecting electrode 202 on the IC 201.

Figure 1B:
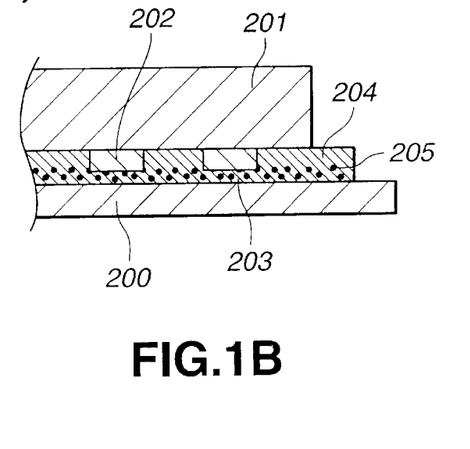

FIG. 1B shows the state in which the IC 201 is provisionally pressure bonded to the glass substrate 200. The pressure bonding of the IC 201 is by pressurization only or by pressurization and heating, with the heating temperature being 70 to 100° C.

Figure 1C:
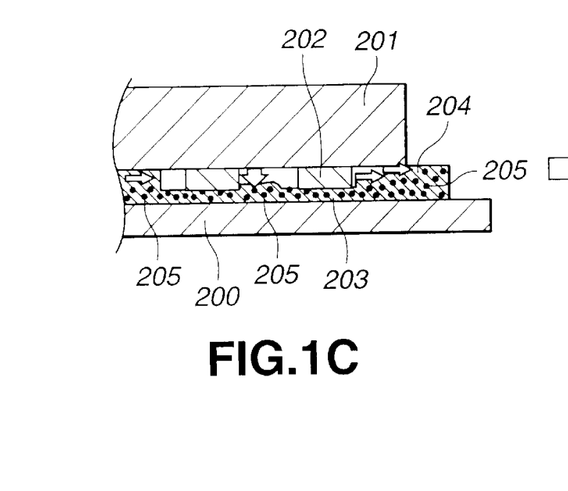
Figure 1D:
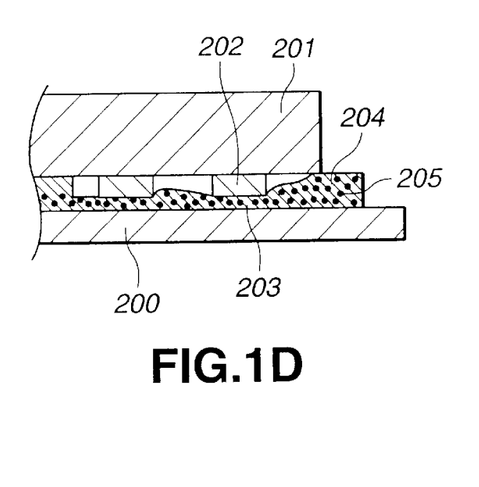

FIG. 1C shows the state of ultimate pressurization of the IC 201 on the glass substrate 200. The IC 201 is ultimately pressure bonded under pressurization and heating. Since the heating temperature at this time is higher than the melting temperature of the anisotropic electrically conductive film, the binder is fluidized. At this time, the electrically conductive particles 205, sandwiched between the projecting electrode 202 of the IC 201 and the wiring pattern 203 of the glass substrate 200, is not fluidized, however, the other electrically conductive particles 205 are fluidized. FIG. 1D shows the cured state of the anisotropic electrically conductive film. If pressurization and heating is performed at the time of ultimate pressure bonding, the resin is first fluidized and subsequently cured. The aforementioned sequence of operations represents the connection process.

However, if, when an object is not a glass substrate, but is a printed circuit board (FIGS. 2A–D) 300, the wiring pattern 303 undergoes variations in height on the order of a few µm, or the projecting electrode 202 of the IC 201 undergoes variations in height on the order of a few µm, as in the case of a gold wire bump, as shown in FIGS. 2A–D. In such case, the thickness of the connecting member 204 needs to be equal to the height of the wiring pattern 303 of the printed circuit board 300 (of the order of 20 µm) plus the height of the projecting electrode 202 of the IC 201 (of the order of 20 µm) plus 10 to 20 µm for a safety margin.

In this case, since the connecting member 204 is of an increased thickness at the stage of the initial mounting state of provisional pressure bonding (pressurization), the electrically conductive particles 205 cannot be sandwiched between the wiring pattern 303 of the printed circuit board 300 and the projecting electrode 202 of the IC 201. If then the binder of the connecting member 204 has become fluidized at the time of ultimate pressure bonding (pressurization), the electrically conductive particles 205 similarly are fluidized, such that, when the gap between the wiring pattern 303 of the printed circuit board 300 and the projecting electrode 202 of the IC 201 coincides with the size of the electrically conductive particle 205, the flowing electrically conductive particle is captured therein. However, the electrically conductive particles 205 are not involved in the entire connection, so that electrical connection cannot be achieved.

It may also be necessary to procure components with stringent specifications, thus leading to increased cost.

Figure 2A:
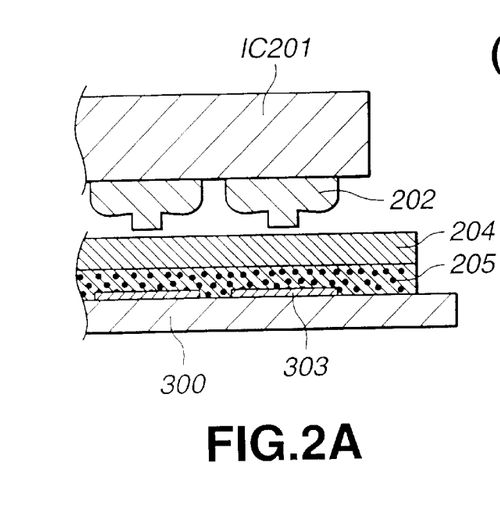
FIGS. 2A, 2B, 2C and 2D are side views of a device cross-section showing alternative methods for electrical connection in a conventional electronic device.

FIG. 2A shows the state in which a connecting member 204, such as an anisotropic electrically conductive film, has been bonded to the printed circuit board 300. The anisotropic electrically conductive film is usually bonded to the printed circuit board 300 by thermal pressure bonding (pressurization with heating), with the pressure being of the order of 100 N/cm2 and the heating temperature being of the order of 70 to 100° C. In this state, wiring pattern 303 on the printed circuit board 300 is aligned with the projecting electrode 202 of the IC 201.

Figure 2B:
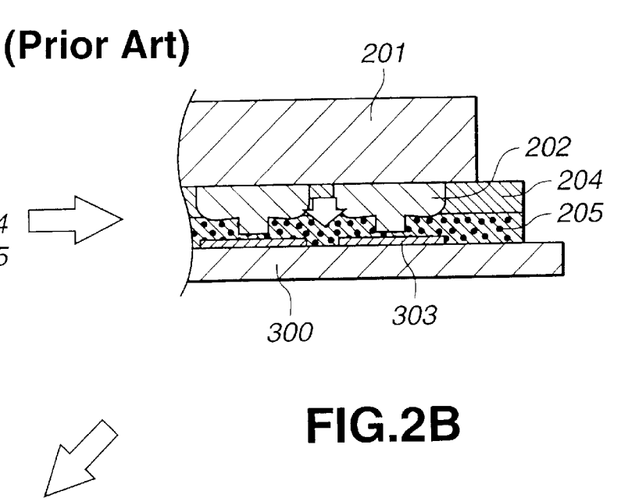
Figure 2C:
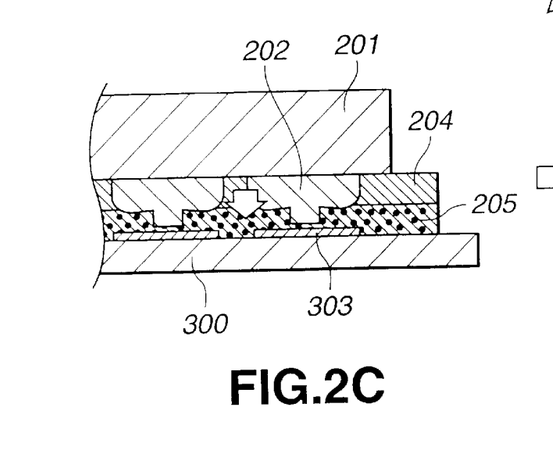

FIG. 2B shows the state of provisional pressure bonding of the IC 201 to the printed circuit board 300. The IC 201 is provisionally bonded under pressurization with or without heating, with the heating temperature being on the order of 70 to 100° C.

FIG. 2B shows the state in which the IC 201 is provisionally pressure-bonded to the printed circuit board 300. The ultimate pressure bonding of the IC 201 is under pressurization and heating. Since the heating temperature at this time is higher than the melting temperature of the anisotropic electrically conductive film, the binder is fluidized. Since no electrically conductive particles are captured between the projecting electrode 202 of the IC 201 and the wiring pattern 303 of the printed circuit board 300, all of the electrically conductive particles are fluidized. Thus, when the gap size between the wiring pattern 303 of the printed circuit board 300 and the projecting electrode 202 of the IC 201 is equal to the particle size of the electrically conductive particle 205, the flowing electrically conductive particle 205 is captured therein. Therefore, the electrically conductive particles 205 are not present in the totality of the electrode gaps.

Figure 2D:
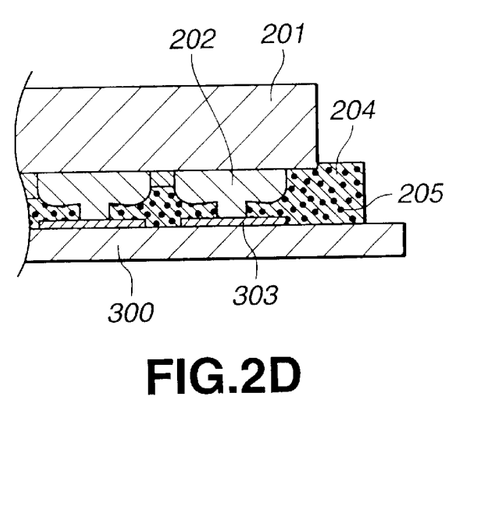

FIG. 2D shows the cured state of the anisotropic electrically conductive film. If pressurization and heating are effected in the ultimate pressure bonding, the resin is first fluidized and subsequently cured. This process represents the connection process. Therefore, if electrical connection via the electrically conductive particles can be made irrespective of slight irregularities on the printed circuit board in question or of slight irregularities on the projecting electrode of the IC, sufficient reliability can be achieved even with a low-cost printed circuit board.

SUMMARY OF THE INVENTION

It is therefore an object of the present invention to provide an electrical connecting member and a method for electrical connection in which an electrical connection can be reliably achieved despite slight irregularities on the objects to be interconnected.

In one aspect, the present invention provides an electric connecting device for electrically connecting an electrical connecting portion of a first object to an electrical connecting portion of a second object, including a first film-shaped adhesive layer arranged as an adhesive layer on the first object, the first film-shaped adhesive layer being composed of a plurality of electrically conductive particles and a binder containing the electrically conductive particles, and a second film-shaped adhesive layer arranged on the first film-shaped adhesive layer, the second film-shaped adhesive layer being composed only of a binder lower in melting temperature than the binder.

For electrically connecting the electrical connecting portion of the first object to the electrical connecting portion of the second object, the electric connecting device includes the first film-shaped adhesive layer containing electrically conductive particles and a second film-shaped adhesive layer formed exclusively by a binder lower in melting temperature than the binder of the first film-shaped adhesive layer.

The first film-shaped adhesive layer containing the electrically conductive particles is an adhesive layer arranged on the first object. On the adhesive layer of the first film-shaped adhesive layer is arranged the second film-shaped adhesive layer constituted exclusively by the binder lower in melting point than the binder of the first film-shaped adhesive layer.

The film-shaped adhesive layer containing the electrically conductive particles and the second film-shaped adhesive layer arranged on it are sometimes collectively referred to herein as a dual-layer film-shaped adhesive layer.

By simply arranging the dual-layer film-shaped adhesive layer on the first object, the electrical connecting portions of the first and second objects can be tightly bonded to each other by the first pressuring heating step of heating and pressuring at a temperature not higher than the melting point of the binder containing electrically conductive particles and not lower than the melting point of the binder of the overlaying layer (binder of the second film-shaped adhesive layer), despite slight irregularities on the first object, with only the binder of the second film-shaped adhesive layer being fluidized, with the electrically conductive particles of the first film-shaped adhesive layer then being not mobile. Thus, the electrical connecting portion of the first object can be positively electrically connected to the electrical connecting portion of the second object, using electrically conductive particles contained in the first film-shaped adhesive layer.

In the above electric connecting device, the electrically conductive particles are substantially of a uniform particle size, and the second film-shaped adhesive layer is an adhesive of the same or analogous quality as the binder of the first film-shaped adhesive layer.

Thus, the binder of the dual-layer film-shaped adhesive layer is reacted on pressuring and heating to bond the first and second objects together. Since the electrically conductive particles are of a substantially uniform diameter, the electrically connecting portions of the first and second objects can be electrically connected to each other without floating, as the electrically conductive particles are positively captured in-between the electrically connecting portions.

In the above electric connecting device, the thickness of the first film-shaped adhesive layer is set to be approximately equal to or larger than the diameter of the electrically conductive particles. Thus, there is no risk of the electrically conductive particles being protruded from the first film-shaped adhesive layer.

In the above electric connecting device, the viscosity of the adhesive of the second film-shaped adhesive layer is set to be lower than that of the first film-shaped adhesive layer.

The binder of the second film-shaped adhesive layer is preferentially caused to flow between the first and second objects simply by pressuring without heating. Therefore, the electrically conductive particles can be positively maintained in position, without the first film-shaped adhesive layer containing the electrically conductive particles being immobile.

In the above electric connecting device, the electrical connecting portion of the first object is a wiring pattern of a circuit substrate, while the electrical connecting portion of the second object is a projecting electrode of an electronic component. The electrically conductive particles in the adhesive layer of the first film-shaped adhesive layer electrically connect the wiring pattern of the circuit substrate to the projecting electrode of the electronic part.

This establishes positive electrical connection between the wiring pattern of the printed circuit board and the projecting electrodes of the electronic component using electrically conductive particles of the adhesive layer of the double-layer film-shaped adhesive.

In another aspect, the present invention provides an electric connecting method for electrically connecting an electrical connecting portion of a first object to an electrical connecting portion of a second object, including an adhesive layer arranging step of arranging a first film-shaped adhesive layer formed by a plurality of electrically conductive particles and a binder containing the electrically conductive particles on the electrical connecting portion of the first object and arranging a second film-shaped adhesive layer formed solely of a binder on the first film-shaped adhesive layer, and a connecting step of performing heating and pressuring for electrically connecting the electrical connecting portion of the first object to the electrical connecting portion of the second object by electrically conductive particles contained in the first film-shaped adhesive layer.

In the above method, in the adhesive layer arranging step, the first film-shaped adhesive layer, composed of plural electrically conductive particles and a binder containing plural electrically conductive particles and the second film-shaped adhesive layer is placed on the electrical connecting portion of the first object. The second film-shaped adhesive layer, composed only of the binder, is then placed on the first film-shaped adhesive layer.

In the connecting step, the electrical connecting portions of the first and second objects are electrically connected by the electrically conductive particles of the first film-shaped adhesive layer under heating and pressurization.

In this manner, if the double-layer film-shaped adhesive is arranged on the first object, the respective electrical connecting portions of the first and second objects are fluidized by the film-shaped adhesive layer becoming secured between the first and second objects. Thus, only the second film-shaped adhesive layer composed exclusively of the binder is fluidized, with the electrically conductive particles of the first film-shaped adhesive layer remaining stationary. This creates a tight bonding of the first and second objects despite certain irregularities on the first object; the electrical connection portion of the first object can be reliably electrically connected to the electrical connection portion of the second object using the electrically conductive particles of the first film-shaped adhesive layer.

In the above method, the connecting step includes a first pressuring heating step by applying pressure at a temperature not higher than the melting temperature of the binder containing the electrically conductive particles, and not lower than the melting temperature of the binder of the second film-shaped adhesive layer. The connecting step also includes a second pressuring heating step of effecting heating and pressuring at a temperature higher than the reaction starting temperature of the binder containing the electrically conductive particles and the binder of the second film-shaped adhesive layer.

In the first pressuring heating step, only provisional curing occurs, because the pressurization occurs at a temperature not higher than the melting point of the binder containing the electrically conductive particles, and not lower than the melting point of the binder of the second film-shaped adhesive layer arranged as an overlying layer.

In the second pressuring heating step, the two binders are completely cured by heating and pressurization at a temperature higher than the reaction starting temperature of the binder containing the electrically conductive particles. The binder arranged as an overlying layer (the binder of the second film-shaped adhesive layer as its sole component).

In the above method, the binder containing the electrically conductive particles and the binder of the second film-shaped adhesive layer arranged as an overlying layer are of the same or analogous components.

The present invention thus provides a way that electrical connection via electrically conductive particles can be realized positively despite slight irregularities on the object surfaces.

DESCRIPTION OF THE PREFERRED EMBODIMENTS

Referring to the drawings, preferred embodiments of the present invention will be explained in detail.

The embodiments explained below represent preferred embodiments of the present invention and hence are specified to achieve technically desirable features. However, the present invention is not limited to the specified embodiments shown in the following description unless limiting statement is made therein.

Figure 3:
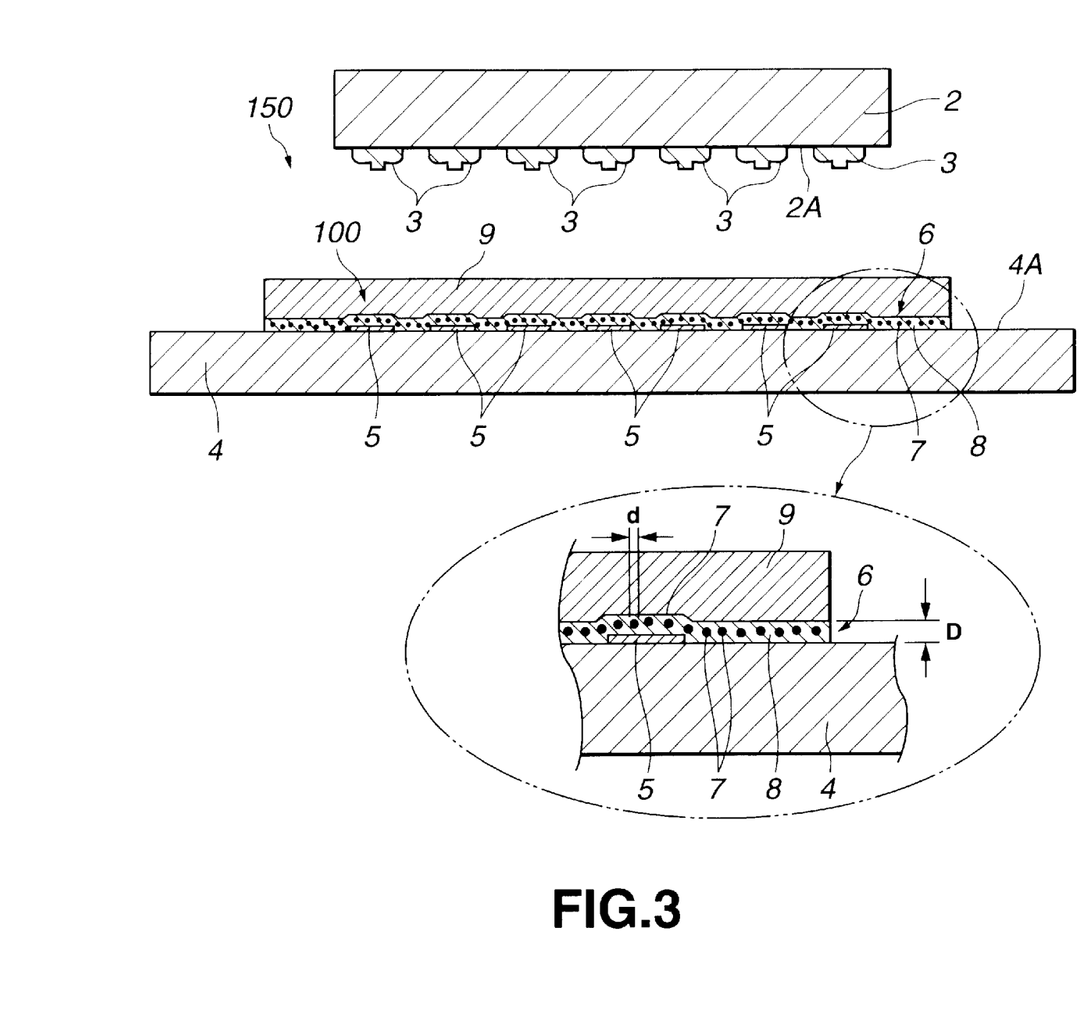
FIG. 3 is a side view of a cross-section of an illustrative electronic device having an electrical connecting device according to the present invention.

FIG. 3 shows an example of an electronic device electrically connected by a preferred embodiment of an electrical connecting device 100 according to the present invention. The electronic device includes a printed circuit board 4 and an integrated circuit (IC) 2 as typical of an electronic component.

A wiring pattern 5 in the shape of a pre-set pattern is formed on a surface 4A of the printed circuit board 4. This wiring pattern 5 is an electric wiring pattern formed of, for example, aluminum or copper.

The IC 2 has, on its surface 2A, a plurality of projecting electrodes 3. These projecting electrodes 3, also termed bumps, are protuberantly arranged to register with, for example, the wiring pattern 5 of the printed circuit board 4.

The printed circuit board 4 corresponds to the first object. The wiring pattern 5 on the printed circuit board 4 corresponds to the wiring pattern on the printed circuit board. The IC 2 is an electronic component corresponding to the second object. The electrical connecting device 100 has the function of electrically connecting the wiring pattern 5 of the printed circuit board 4 to the projecting electrodes 3 on the IC 2 and of positively bonding the printed circuit board 4 and the IC 2 to each other.

The electrical connecting device 100 is explained below.

Referring to Fig.3, the electrical connecting device 100 is made up of a first film-shaped adhesive layer 6, containing electrically conductive particles, and a second film-shaped adhesive layer 9 formed only of a binder.

The first film-shaped adhesive layer 6, containing the electrically conductive particles, is a film-shaped layer arranged on the surface 4A of the printed circuit board 4, and is bonded to the surface 4A to overlie the wiring pattern 5.

The first film-shaped adhesive layer 6 contains the electrically conductive particles 7 and the binder 8. Plural electrically conductive particles 7 are contained in the binder 8. The electrically conductive particles 7 are spherically-shaped and prepared by plating Ni to a thickness of, for example, 30 to 1000 Å on, for example, a plastic resin particle, with a diameter of, for example, 5 to 10 μm, and further plating Au thereon to a thickness of, for example, 5 to 10 μm, or prepared from Ni metal powders with a diameter of, for example, 5 to 10 μm.

The binder 8 contains plural electrically conductive particles 7 and holds them against sporadic movement. The binder 8 is formed of, for example, an electrically insulating heat-curable epoxy resin.

The thickness D of the binder 8 is set so as to be equal to or slightly larger than the diameter d of the electrically conductive particle 7. This completely encapsulates the electrically conductive particle 7 in the binder as the electrically insulating layer without protruding therefrom.

The electrically conductive particles 7 are preferably uniformly arrayed in the binder 8, as shown in FIG. 3.

The second film-shaped adhesive layer 9, formed only of the binder, is arranged on the first film-shaped adhesive layer 6 containing electrically conductive particles, and is of a dual-layer structure. The film-shaped adhesive layer 9, formed only of a binder, is formed of, for example, a heat-curable epoxy resin. The binder 8 and the film-shaped adhesive layer 9, formed only of a binder, may preferably be the same or analogous reactive adhesive which performs the same reaction when subjected to pressurization and heating.

The viscosity of the second film-shaped adhesive layer 9, formed only of the binder, has its viscosity set to be lower than the viscosity of the binder 8. Specifically, the second film-shaped adhesive layer 9, formed only of the binder, is more fluid than the binder 8, such that, when the second film-shaped adhesive layer 9 is thrust via the electrical connecting device 100 against the surface 4A of the printed circuit board 4, only the second film-shaped adhesive layer 9 formed only of the binder is fluidized in a space between the first film-shaped adhesive layer 6 containing the electrically conductive particles and a surface 2A of the IC 2 so as to be charged therein.

Referring to FIGS. 4A–D and 5, a preferred embodiment of the method of electrically connecting the IC 2 to the printed circuit board 4 using the electrical connecting device 100 is explained.

Figure 5:
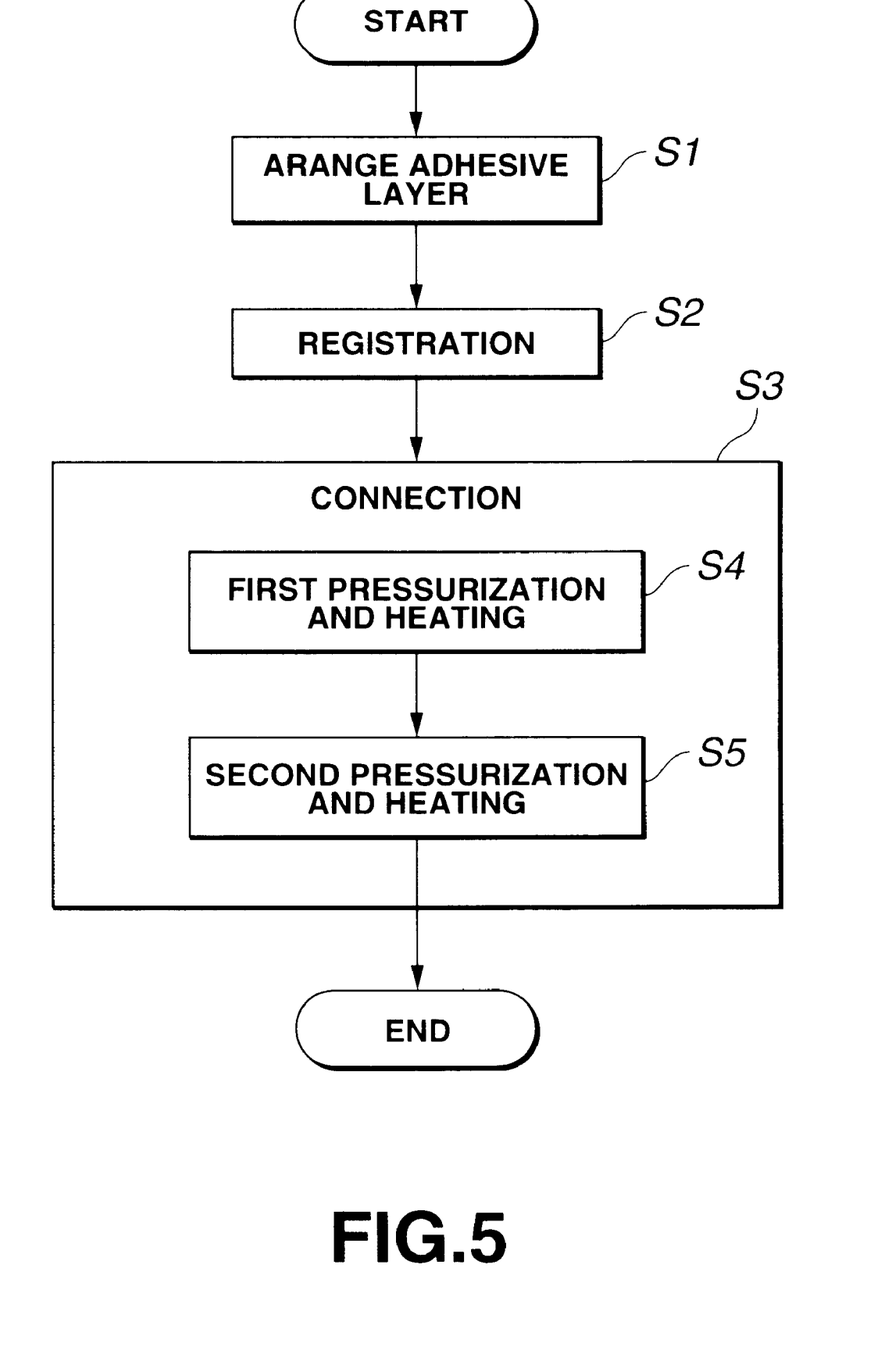
FIG. 5 is a flowchart showing an illustrative method for electrical connection according to the present invention.

Adhesive Applying Step S1 of FIG. 5

At step S1, the first film-shaped adhesive layer 6, containing electrically conductive particles, and the second film-shaped adhesive layer 9, containing only the binder, and which is arranged on the first film-shaped adhesive layer 6 containing the electrically conductive particles, are bonded to the surface 4A of the printed circuit board 4. The first film-shaped adhesive layer 6 containing electrically conductive particles is bonded in position to overlie the wiring pattern 5. In this state, the electrically conductive particles 7 are completely contained in the binder 8.

The second film-shaped adhesive layer 9, formed exclusively by the binder, is arranged on the first film-shaped adhesive layer 6 containing the electrically conductive particles, to provide a double-layer structure comprised of the first film-shaped adhesive layer 6 containing the electrically conductive particles and the second film-shaped adhesive layer 9 formed exclusively by the binder.

Registration Step S2 of FIG. 5

Figure 4A:
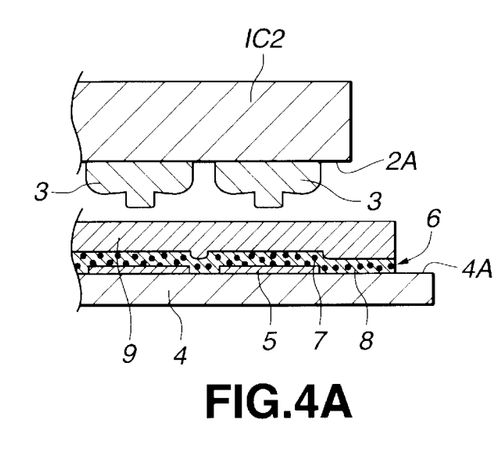
FIGS. 4A, 4B, 4C and 4D are side views illustrating typical electrical connection of an electronic device by the electrical connecting device.

At step S2, the IC 2 is positioned relative to the printed circuit board 4, as shown in FIGS. 4A and 3. That is, the projecting electrodes 3 of the IC 2 are set to register with the corresponding wiring pattern 5.

Connection Step S3 of FIG. 5

The connection step S3 has a first pressurization heating step S4 and a second pressurizing heating step S5.

Figure 4B:
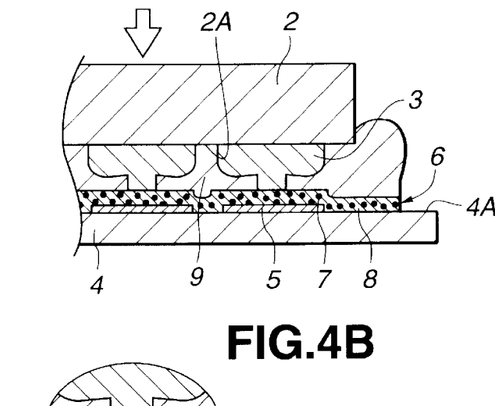

At the first pressurization heating step S4, the IC 2 is set on the first film-shaped adhesive layer 6 containing the electrically conductive particles, as shown in FIG. 4B. The second film-shaped adhesive layer 9, formed exclusively by the binder, is caused to flow as it is spread apart, while the first film-shaped adhesive layer 6 containing the electrically conductive particles maintain its shape. Thus, the second film-shaped adhesive layer 9, formed exclusively by the binder, is charged substantially completely in the space between the surface 2A of the IC 2 and the first film-shaped adhesive layer 6 containing the electrically conductive particles, as shown in FIG. 4B.

The reason is that the second film-shaped adhesive layer 9 formed exclusively by the binder is lower in viscosity than the first film-shaped adhesive layer 6 containing the electrically conductive particles and hence only the second film-shaped adhesive layer 9 formed exclusively by the binder is spread to the ambient space, while the second film-shaped adhesive layer 9 formed exclusively by the binder is charged into the space between the surface 2A of the IC 2 and the first film-shaped adhesive layer 6 containing the electrically conductive particles.

In the state shown in FIG. 4B, the second film-shaped adhesive layer 9 constituted exclusively by the binder is simply kept in the provisionally cured state. Therefore, the heat applied at this time is such that the temperature is not higher than the melting temperature of the binder 8 containing electrically conductive particles and not lower than the melting temperature of the overlying second film-shaped adhesive layer 9. This may be exemplified by applying heat such as 120° C., continuing for 3 seconds, with the pressure being approximately 3 kg/mm² of an area of a surface of the projecting electrodes 3 of the IC 2 connecting to the wiring pattern 5 of the printed circuit board 4 via the electrically conductive particles 7.

Figure 4C:
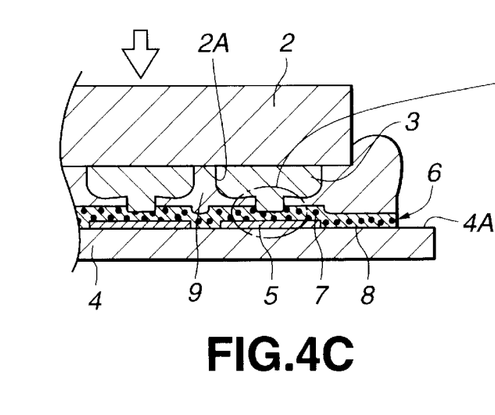

Then, at the second pressuring and heating step S5, the pressure applied is equivalent to or even higher than that used in the first heating step S4. The binder 8 and the second film-shaped adhesive layer 9 formed exclusively by the binder are heated to a higher temperature, as shown in FIG. 4C.

The temperature used at this time for heating is higher than the reaction start temperature of the second film-shaped adhesive layer 9 constituted exclusively by the binder, such as 180 to 230° C., with the heating time duration being 20 to 30 seconds. The pressure applied at this time is 3 to 5 kg/mm² of the surface of the projecting electrodes 3 of the IC 2 connected via the electrically conductive particles 7 to the wiring pattern 5 of the printed circuit board 4.

Figure 4D:
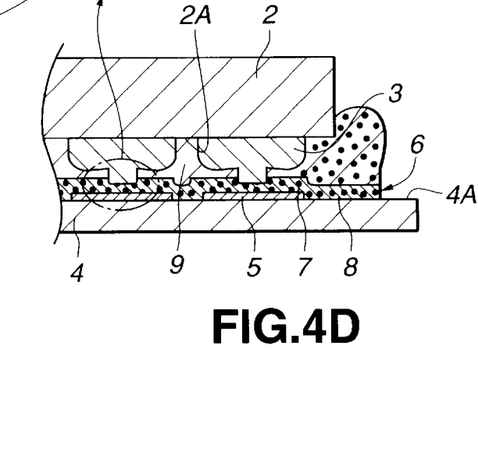

Thus, the binder 8 and the second film-shaped adhesive layer 9, formed exclusively by the binder, are preferably of the same or similar material, and hence may be cured subsequently simultaneously. The result is that the respective projecting electrodes 3 can be positively electrically connected to the wiring pattern 5 using the electrically conductive particles of the first film-shaped adhesive layer 6, as shown in FIG. 4D.

When the IC 2 is heated, as it is pressed towards the printed circuit board 4, only the second film-shaped adhesive layer 9, constituted solely by the binder arranged on the first film-shaped adhesive layer 6 containing the electrically conductive particles, is fluidized, thus assuring sufficient electrical insulation between the IC 2 and the printed circuit board 4 despite slight irregularities in the IC 2 and the printed circuit board 4. Since only the second film-shaped adhesive layer 9 constituted exclusively by the binder arranged on the first film-shaped adhesive layer 6 containing the electrically conductive particles is fluidized, it is possible to decrease voids (air area) between the IC 2 and the printed circuit board 4 to improve the reliability, despite slight irregularities in the IC 2 and the printed circuit board 4.

Moreover, by this pressuring and heating, the second film-shaped adhesive layer 9 formed exclusively by the binder and the binder 8 are cured, so that it is possible for the second film-shaped adhesive layer 9 constituted solely by the adhesive binder and the adhesive binder 8 to positively bond and secure the IC 2 to the printed circuit board 4.

At the first pressuring and heating step S4 of FIG. 4B, the electrically conductive particles 7 are sandwiched between the projecting electrodes 3 and the wiring pattern 5. If, in FIG. 4C, the pressuring equivalent to or even higher than that used in the first heating step S4 is applied, only the electrically conductive particles 7 positioned between the projecting electrodes 3 and the wiring pattern 5 are sandwiched between the projecting electrodes 3 and the wiring pattern 5, while other electrically conductive particles 7 are moved slightly thereabout.

Since the electrically conductive particles 7 are interposed between the IC 2 and the electrodes of the printed circuit board 4, despite slight irregularities in the IC 2 and the printed circuit board 4, the irregularities of the electrodes are compensated to assure sufficient connection reliability.

The electrically conductive particles can be reliably interposed by using a connection resin of a dual structure comprised of the first film-shaped adhesive layer containing the electrically conductive particles having high viscosity, and the second film-shaped adhesive layer 9 constituted solely by the binder of low viscosity.

In the above-described preferred embodiment of the present invention, the electrically conductive particles 7 can be captured more reliably in a space between the projecting electrodes 3 of the IC 2 and the wiring pattern 5 formed on the printed circuit board 4, by equating the thickness of the adhesive layer 6 containing the electrically conductive particles to the diameter of the electrically conductive particles 7.

In the above-described preferred embodiment of the present invention, the second film-shaped adhesive layer 9, constituted solely by the binder, is more fluid at the time of low-pressure pressure bonding, by increasing the viscosity of the binder 8 of the first film-shaped adhesive layer 6 containing the electrically conductive particles, and by lowering the viscosity of the second film-shaped adhesive layer 9 formed exclusively by the binder. Thus, the electrically conductive particles 7 are sandwiched more reliably between the projecting electrodes 3 of the IC 2 and the wiring pattern 5 formed on the printed circuit board 4.

On the other hand, there is no necessity of applying the temperature at the time of low-pressure pressure bonding, such that only the second film-shaped adhesive layer 9 constituted solely by the binder is allowed to flow.

In the preferred embodiment of the present invention, in which the binder 8 of the first film-shaped adhesive layer 6 containing electrically conductive particles is comprised solely by the same or analogous component as that of the second film-shaped adhesive layer 9 constituted solely by the binder, connection reliability remains unaffected even if the binder 8 and the second film-shaped adhesive layer 9 constituted solely by the binder become blended when the binder 8 and the second film-shaped adhesive layer 9 become fluidized on heating.

In the above-described preferred embodiment of the present invention, if the first pressuring is at a temperature not higher than the melting temperature of the binder 8, the first film-shaped adhesive layer 6 containing the electrically conductive particles can maintain its film shape, so that the electrically conductive particles 7 can be captured reliably between the projecting electrodes 3 of the IC 2 and the wiring pattern 5 formed on the printed circuit board 4.

According to the present invention, as described above, it is possible to realize the connecting member and the connecting method for establishing electrical connection via the electrically conductive particles 7 despite slight irregularities of the wiring pattern 5 formed on the printed circuit board 4.

By employing the first film-shaped adhesive layer 6 containing electrically conductive particles of a film-shaped connection resin of high viscosity, electrically conductive particles 7 of a diameter equal to the film thickness and the second film-shaped adhesive layer 9 constituted solely by the binder of a connection resin of low viscosity, it is possible to establish electrically conduction with the electrically conductive particles 7 interposed between the projecting electrodes of electronic parts such as a bare chip, and the electrically conductive pattern of the object.

The first film-shaped adhesive layer 6 containing the electrically conductive particles having a thickness equivalent to the diameter of the electrically conductive particles, and which is bonded at a pre-set position of the wiring pattern of an object, the second film-shaped adhesive layer 9 arranged on the first film-shaped adhesive layer 6 and which is constituted exclusively by the binder formed of the same reactive adhesive as the binder component of the first film-shaped adhesive layer, the wiring pattern 5 of the object and the projecting electrode of the IC, are aligned to one another, and the electrical connection is established by pressuring followed by heating and pressuring.

The first pressuring may be comprised of pressuring and heating at a temperature not higher than the melting temperature of the binder 8 of the first film-shaped adhesive layer 6 containing the electrically conductive particles, followed by heating and pressuring (heating to a temperature not lower than the reaction start temperature of the binder 8 and the binder of the second film-shaped adhesive layer 9 as a sole constituent of the film-shaped adhesive layer 9). This enables the connecting member to be cured.

The result is that, at the time of initial pressuring, only the second film-shaped adhesive layer 9 composed exclusively of the binder comprised of the same reactive adhesive as the component of the binder 8 of the first film-shaped adhesive layer 6 containing the electrically conductive particles is fluidized with the result that the projecting electrode of the IC and the wiring pattern of the object are electrically connected to each other via the electrically conductive particles of the adhesive layer 6 having a thickness equivalent to the diameter of the electrically conductive particles containing the non-fluidized electrically conductive particles.

Also, in the embodiment of the present invention, the viscosity of the adhesive layer 6 containing the electrically conductive particles is increased, while that of the first film-shaped adhesive layer 6 composed only of the binder is lowered.

The result is that only the second film-shaped adhesive layer 9 composed only of the binder formed of the same reactive adhesive as that of the binder of the first film-shaped adhesive layer 6 containing the low-viscosity electrically conductive particles on initial pressuring is fluidized to a greater extent, so that the projecting electrode of the IC and the wiring pattern of the object can be electrically connected via the electrically conductive particles of the adhesive layer 6 having the same thickness as the diameter of the less fluid electrically conductive particles of higher viscosity.

In the preferred embodiment of the present invention, the thickness of the electrically conductive adhesive layer is set so as to be approximately equal to the diameter of the electrically conductive particles present in the adhesive layer.

The result is that, since the electrically conductive particles are present only on the lowermost surface contributing to electrical connection for fine pitch, it is possible to increase the number of the electrically conductive particles present in the adhesive layer. Moreover, since the total number of the electrically conductive particles can be smaller than with the conventionally connection member, insulation at the neighboring electrodes can be maintained more easily.

The present invention is not limited to the above-described embodiment.

In the above-mentioned embodiment the first object is the printed circuit board 4 having the wiring pattern 5, whilst the second object is the IC 2 having the projecting electrodes 3. The first and second objects different from these may be used. For example, the first object may be a glass substrate having a wiring pattern in place of the printed circuit board, while the second object may be an electronic part other than the IC 2.

The projecting electrodes 3 may be designed as plating bumps.

The electrically conductive particles 7 other than the spherically-shaped particles may also be used.

What is claimed is:

1. An electric connecting device for electrically connecting an electrical connecting portion of a first object to an electrical connecting portion of a second object, comprising:

a first adhesive layer on said first object, said first adhesive layer comprising a plurality of electrically conductive particles and a first binder enveloping said electrically conductive particles; and a second adhesive layer arranged on said first adhesive layer, said second adhesive layer being composed only of a second binder, said second binder having a lower melting temperature than said first binder.

2. The electric connecting device according to claim 1 wherein said electrically conductive particles are substantially of the uniform particle size.

3. The electric connecting device according to claim 1 wherein said second adhesive layer is comprised of the same material as the binder of the first adhesive layer.

4. The electric connecting device according to claim 1 wherein the thickness of the first adhesive layer is set so as to be approximately equal to or larger than the diameter of said electrically conductive particles.

5. The electric connecting device according to claim 3 wherein the viscosity of the adhesive of said second adhesive layer is set so as to be lower than that of said first adhesive layer.

6. The electric connecting device according to claim 1 wherein said electrical connecting portion of said first object is a wiring pattern of a circuit substrate;

said electrical connecting portion of said second object is a projecting electrode of an electronic component; and wherein said electrically conductive particles in said first adhesive layer electrically connect the wiring pattern of said circuit substrate to the projecting electrode of said electronic part.

* * * * *